Aug. 16, 1966 W. HARRIES 3,267,376

ELECTRIC MEASUREMENT APPARATUS USING A PAIR OF OPPOSITELY POLED THERMOELECTRIC JUNCTIONS IN PARALLEL AND DIODE STABILIZING MEANS

Filed Dec. 26, 1962

United States Patent Office 3,267,376
Patented August 16, 1966

3,267,376

ELECTRIC MEASUREMENT APPARATUS USING A PAIR OF OPPOSITELY POLED THERMOELECTRIC JUNCTIONS IN PARALLEL AND DIODE STABILIZING MEANS

Wolfgang Harries, Haslet, N.J., assignor to Electronic Associates, Inc., Long Branch, N.J., a corporation of New Jersey Filed Dec. 26, 1962, Ser. No. 247,058
4 Claims. (Cl. 324—106)

This invention relates to apparatus for making electric measurements.

The broad purpose of the present invention resides in providing novel and improved apparatus for measuring the R.M.S. or effective values of varying or fluctuating current or voltage, particularly for alternating-current measurements. As a matter of convenience, it will be understood that where "alternating current" appears below, that term is intended to include other varying or fluctuating electrical waveforms. More specifically, it is an object of this invention to provide apparatus for the measurement of alternating current or voltage in a manner to provide substantially linear readings of effective values over a wide range of input on a direct-current indicating instrument of usual design that provides substantially linear readings in response to impressed direct current.

A still further object of this invention resides in several novel features for improving the foregoing type of apparatus, by providing stability even at low levels of input.

In achieving the foregoing objects, a number of circuits are included in the accompanying drawings and described in detail below as alternative illustrative embodiments of the broad features of the invention. In these illustrative embodiments, two thermoelectric devices are employed, these being substantially matched and each device having a heating resistor and a thermoelectric junction in efficient heat-transfer relationship. The unknown alternating current is supplied to the heating resistor of one of the two thermoelectric devices that are provided. The two thermoelectric junctions of these two devices are connected to a high-gain direct-coupled or operational amplifier, in such manner that the amplifier responds to the difference in thermally generated output of the junctions. The heating resistor of the second thermoelectric device is energized by output of the amplifier. With this arrangement, the amplifier provides that amount of direct-current energization for the heating resistor of the second thermoelectric device so that its related thermoelectric junction is heated enough to balance or cancel the thermally generated output of the thermoelectric junction of the first device to which the unknown alternating-current is supplied. In this condition, the direct-current energization of the second resistor is equal to the R.M.S. or effective value of the unknown electrical energy supplied to the heating resistor of the first thermoelectric device.

The direct-current output that is generated by the junction of the first thermoelectric device depends upon many factors. It depends upon the temperature-versus-voltage output characteristics of the junction itself. It depends upon the temperature rise of the junction as a function of the unknown current or voltage that is supplied. It depends upon the surface area of the thermoelectric device and its heat-dissipating properties, on the proximity of the heating resistor to the junction, on the variation in resistance of the heating resistor as a function of temperature, and on many other factors. However, the second thermoelectric device, substantially a duplicate of the first one, has very nearly identical parameters and it has like output from the thermoelectric junction versus energy supplied to the resistive heater.

The direct-coupled amplifier, or operational amplifier, is normally capable of providing wide output excursions both above and below the potential of the reference point or "ground." I have found that there is a strong tendency of the instrument as thus far described to become unstable in the absence of appreciable input at the "unknown" terminals. I have found that by inserting a diode at the output end of the amplifier or the input of the heating resistor of the second thermoelectric device, the apparatus can be made stable. This is achieved without impairing the important characteristics of the apparatus already considered. Devices and circuits having characteristics that discriminate sharply against one polarity or direction of current flow may be used in place of the diode that appears in the preferred forms of apparatus shown in the drawings.

The nature of the invention, including the foregoing and other objects and features of novelty, will be better understood from the following detailed description of the illustrative but presently preferred embodiments which appear in the accompanying drawings. In the drawings.

Figure 1:
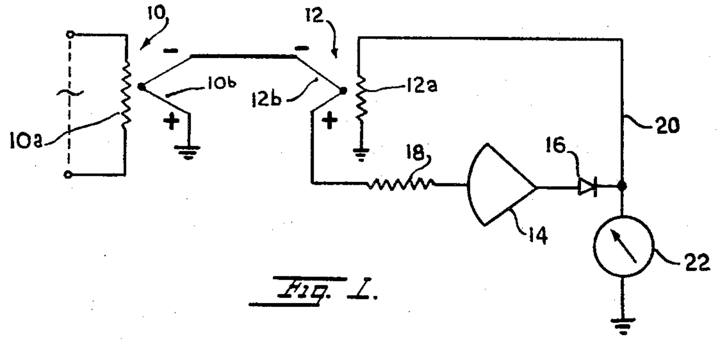
FIGURE 1 is the wiring diagram of a presently preferred embodiment of the invention.

Referring now to FIGURE 1, a pair of thermoelectric devices 10 and 12 are represented. The thermoelectric device 10 is of a well-known design, including a heating resistor **10*a* and a thermoelectric junction 10*b*. This is commonly a thermocouple formed by uniting two wires of different metals, or it may be a junction that includes a so-called thermoelectric material. When current flows in resistor 10*a*, there is a temperature rise at the thermoelectric junction 10*b*, and this results in generation of relatively low values of D.-C. voltage output from the junction. Thermoelectric device 12 similarly includes a heating resistor 12*a* and a thermoelectric junction 12*b*. Preferably, devices 10 and 12 are accurately matched. An amplifier 14 is diagrammatically represented, this being a direct-coupled high-gain amplifier. Chopper-stabilized direct-coupled amplifiers are particularly well suited to use in this apparatus. This output end of amplifier 14 is connected through a diode 16 and lead 20 to heating resistor 12*a*, which is returned to ground. A negative feed-back loop into the input of amplifier 14 is established by the heating effect exerted by the heating action of the current through heating resisor 12*a* on the thermoelectric junction 12*b* and by connecting junctions 10*b* and 12*b* in series-opposition between ground (as a reference point) and the input end of amplifier 14. Resistor 18 may be interposed, as shown, to limit the maximum current into the amplifier. A direct-current indicating instrument 22 is connected across the terminals of heating resistor 12*a* in FIGURE 1. In this position, as explained more fully below, the apparatus provides a linear voltage indication that is equal, to a close approximation, to the effective voltage impressed on resistor 10*a***.

In operation, input is supplied to heating resistor **10*a* and the heat that results causes generation of a small D.-C. voltage in thermoelectric junction 10*b*. This is impressed on the input end of amplifier 14 through thermoelectric junction 12*b* and resistor 18. Amplifier 14 provides output which is delivered through diode 16 in what amounts to a thermal negative feedback loop that includes heating resistor 12*a* of the second thermoelectric device 12. Diode 16 is forward-conducting at this time. The amplifier output rises to that point at which the heating in resistor 12*a* causes thermoelectric junction 12*b* to generate a voltage which is virtually equal and opposite to that produced by junction 10*b*. The complex factors resulting in the thermoelectric conversion in device 10** are reversed in the matched thermoelectric device 12. Since direct-current instrument 22 measures the direct-current energization of resistor 12*a*, it provides a reading which is equal to the R.M.S. value of the alternating-current energization impressed on heating resistor 10*a*. This reading is on a linear scale that is characteristic of D.-C. meters.

Diode 16 is preferably a solid-state device such as a silicon junction diode, or it may be a vacuum-tube diode. To a degree, each of these diodes has a non-linear forward-conducting characteristic. Neither diode becomes forward-conducting until the voltage in the diode circuit reaches some small but definite threshold voltage, usually below one-half of a volt. The direct-coupled amplifier 14 may also be non-linear. Subject to threshold conditions of the diode, the entire system functions to the end result that the direct-current energization of resistor 12*a* varies linearly with, and is equal to, the R.M.S. or effective alternating-current impressed on heating resistor 10*a* where the devices 10 and 12 are matched.

With the polarity of diode 16 as shown, it may be assumed that junction 10*b*, when heated, produces "minus" potential input to amplifier 14. Under balanced conditions, junction 12*b* provides an equal and opposite input to amplifier 14. However, in the absence of any input to heating resistor 10*a*, a low-order spurious positive signal might appear at the input end of high-gain amplifier 14. This spurious positive input signal results in a negative output voltage. If there were no diode 16, then a feedback signal would be impressed on heating resistor 12*a*. This would produce in junction 12*b* a further positive potential tending to drive amplifier 14 in a manner to increase the energy supplied to resistor 12*a*. Diode 16 discriminates sharply against any such spurious current being delivered by amplifier 14 to resistor 12*a*.

Diode 16 is not an ideally perfect diode because, in practice, a small rise in voltage above zero is necessary before the diode reaches the low-resistance forward-conducting portion of its characteristic. With sufficient gain of amplifier 14, the heating current supplied to resistor 12*a* is affected almost not at all by either this forward threshold of the diode or by non-linearity in the amplifier. The diode is at the high-level end of the amplifier, where this threshold effect of the diode is of minimal concern.

High gain at low values of input is an important characteristic of amplifier 14, in order to reduce the net difference in output of junctions 10*b* and 12*b* to virtually zero. Amplifier 14 has high gain not only for small values of input of the significant polarity but, in practice, it also has high gain for reverse-polarity, spurious input. Diode 16 suppresses reverse currents to resistor 12*a* that would result from spurious input.

The diode 16 is chosen so that it has a high back resistance compared with the resistance of the circuit of heating resistor 12*a*. This promotes sharp discrimination against one direction of current flow in resistor 12*a* which is opposite to the direction of current flow that normally occurs when junction 10*b* is heated.

Figure 2:
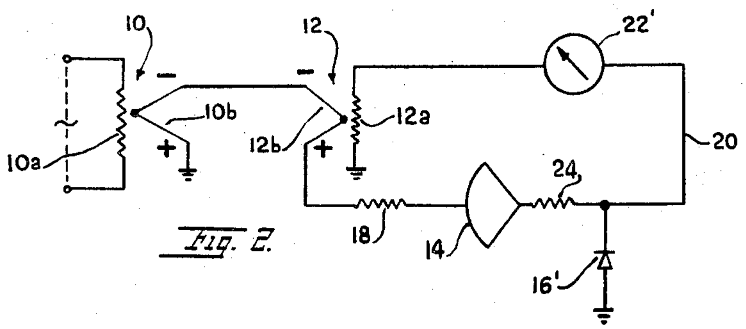
FIGURES 2 and 3 are modifications of the embodiment in FIG. 1.

Another embodiment of the invention is illustrated in FIGURE 2. Description of details of the circuit of FIGURE 2 that are the same as FIGURE 1 need not be repeated, but will be readily recognized. The parts in FIGURE 2 which correspond to those in FIGURE 1 bear the same numerals in both figures.

In FIGURES 2, at the output of the amplifier there is a different arrangement for suppressing one direction of flow of current in the loop containing resistor 12*a*. In series with the output of amplifier 14 and resistor 12*a* is a resistor 24; and at the output end of resistor 24, extending to ground, is a diode 16′. This is polarized so that the diode will not conduct for those output conditions which result from heating of junction 10*b*. By like token, if the amplifier output should reverse as a result of a spurious signal anywhere, then diode 16′ becomes forward-conducting and suppresses any appreciable flow of current to resistor 12*a*.

In FIGURE 2, resistor 12*a* is connected in series with a current-indicating direct-current instrument 22′, conveniently a milliammeter. With this connection, the readings of milliammeter 22′ will linearly represent the effective value of the current that flows in heating resistor 10*a*. By comparison, the electrical instrument 22 in FIGURE 1 provides readings of effective voltage.

Figure 3:
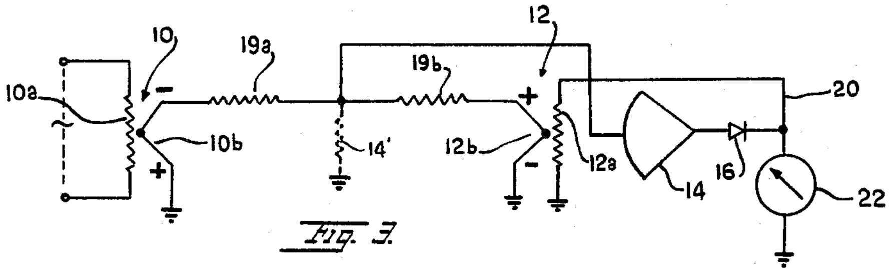

The junctions 10*b* and 12*b* in FIGURES 1 and 2 are connected in series-opposition to amplifier 14, in a simple series circuit. FIGURE 3 illustrates another circuit arrangement of the thermoelectric junctions at the input end of amplifier 14 for achieving balance in the two junctions 10*b* and 12*b* when input is impressed on resistor 10*a*.

In FIGURE 3, thermoelectric junction 10*b* and a resistor 19*a* are connected in a series circuit between ground and the input end of amplifier 14. Junction 12*b* and resistor 19*b* are also connected in a series circuit between ground and the input end of amplifier 14. These two circuits containing the thermoelectric junctions are in parallel (rather than in series as in FIGURES 1 and 2) but the output polarities of the junctions are in opposition at the input end of the amplifier. With the same polarization of diode 16 as in FIGURES 1 and 2, the negative terminal of junction 10*b* is connected to the input of amplifier 14. The positive terminal of junction 12*b* is connected to the input end of the amplifier. The input resistance of the amplifier that is represented in FIGURE 3 by dotted-line resistor 14′ also extends to ground. Resistors 19*a* and 19*b* are matched.

In operation, with no input to resistor 10*a*, the amplifier input terminal is at ground potential. Heating of junction 10*b* tends to cause current flow through resistors 19*a* and 19*b* and junction 12*b*. Some current also tends to flow in the amplifier input path 14′, but this may be assumed to be small. Nearly half the voltage output of junction 10*b* is impressed on amplifier 14. Resulting output from the amplifier to resistor 12*a* heats junction 12*b*. Current continues to flow in the simple series circuit of junctions 10*b* and 12*b* and resistors 19*a* and 19*b*. However, the amplifier input terminal is restored to ground potential when there is balance between the output of junctions 10*b* and 12*b*. As in FIGURE 1, the reading of D.-C. voltmeter 22 then represents the effective voltage impressed on resistor 10*a*.

It has been indicated that the invention makes possible a linear indication on a direct-current indicating instrument those values of input current or voltage that would ordinarily be available on a grossly non-linear scale found in customary types of alternating-current indicating instruments. This characteristic of linearity is realized over virtually the entire range of the apparatus, except for that small portion of the range at the very bottom of the scale where the generated voltage of junction 10*b*, when multiplied by the amplifier gain, is still of the same magnitude as the forward threshold of the diode characteristic. With appropriate choice of ranges, this detail of threshold at the lower limit of the scale can be made of minimal concern.

Figure 4:
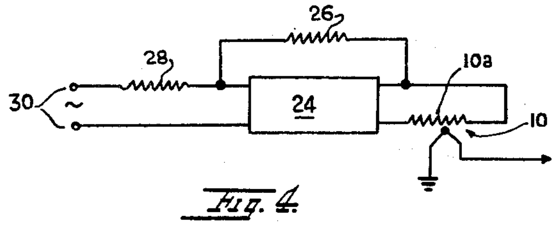
FIGURE 4 is the wiring diagram of a circuit modification applicable to FIGURES 1–3.

It has been indicated that devices 10 and 12 are matched, and in practice they can be matched to a close approximation. However, it may be desirable to provide calibration for more precise readings. In order to do that, measured values of direct current or D.-C. voltage can be supplied to resistor 10*a*, and the corresponding output as read on meters 22 and 22′ can be tabulated against the actual meter readings, or the scale of the meter itself can be made direct-reading following such calibration. Further, in the event of minor degrees of mismatch, it may be found desirable to interpose small trimming resistors in the circuits of the heating resistors 10*a* and 12*a*. As a further variation that is presently contemplated, a high-gain direct-coupled 100 percent negative-feedback amplifier may advantageously be interposed between the source of the unknown voltage or current and resistor 10*a*. Such an amplifier acts as a buffer and thus avoids imposition of resistor 10*a* as a load on the unknown source. Such an amplifier can also be utilized to provide automatic limiting, for avoiding damage to resistor 10*a* that might result from too-high input voltage directly applied to this resistor. This amplifier need not be direct-coupled where only true alternating current is to be measured, but it should be direct-coupled if the unknown current or voltage has a direct-current component. In FIGURE 4, amplifier 24 which includes feedback resistors 26 and 28 arranged to provide negative feedback, provides impedance isolation between input terminals 30 and the resistor 10*a* of device 10.

Various modifications and varied application of the novel features in the foregoing illustrative embodiments will occur to those skilled in the art. Consequently, it is appropriate that the invention should be broadly construed in accordance with its full spirit and scope.

What is claimed is:

1. Apparatus for measuring the effective value of an unknown electric current or voltage, including a pair of substantialy matched thermoelectric devices having first and second heating resistors and first and second thermoelectric junctions, respectively, input connections to couple said first resistor to the source of the unknown current or voltage, means for supplying direct current to said second resistor in an amount to cause said second junction to produce an output equal to that of said first junction, and means for measuring the direct-current energization of said second resistor and thereby providing the desired measurement, said direct-current supplying means including a high-gain direct-coupled amplifier, a pair of matched resistors, said first junction having one terminal connected to a point of reference potential and the other terminal connected in series circuit with a first one of said pair of matched resistors, said second junction having one terminal connected to a point of reference potential and the other terminal connected in series circuit with a second one of said pair, means connecting the ends of said pair of matched resistors remote from said first and second junctions to the input of said amplifier and said junctions being oppositely polarized relative to said amplifier to adapt the amplifier to respond to the difference in thermoelectric output between said first and second junctions, and output connections from said amplifier to said second resistor, the resulting current in said second resistor flowing in a certain direction when said first junction is heated, said direct-current supplying means including sharply discriminating means at a high-level part of said amplifier for suppressing current flow to said second heating resistor in the direction opposite to said certain direction.

2. The apparatus of claim 1 in which said discriminating means is a diode.

3. The apparatus of claim 2 in which said diode is connected between said output connections from said amplifier and said second heating resistor.

4. The apparatus of claim 3 in which said measuring means is a voltage indicating meter connected between (1) the junction of said diode and said second heating resistor and (2) said point of reference potential.

References Cited by the Examiner

UNITED STATES PATENTS

| | | | |
|---|---|---|---|
| 2,857,569 | 10/1958 | Gilbert | 324—106 |
| 2,471,262 | 5/1959 | Cousins | 330—110 X |

WALTER L. CARLSON, *Primary Examiner.*

RUDOLPH V. ROLINEC, *Examiner.*

G. L. LETT, *Assistant Examiner.*